(12) United States Patent
Griswold et al.

(10) Patent No.: US 10,627,468 B2
(45) Date of Patent: *Apr. 21, 2020

(54) NUCLEAR MAGNETIC RESONANCE (NMR) FINGERPRINTING

(71) Applicant: Case Western Reserve University, Cleveland, OH (US)

(72) Inventors: Mark Griswold, Shaker Heights, OH (US); Nicole Seiberlich, Shaker Heights, OH (US); Vikas Gulani, Shaker Heights, OH (US); Dan Ma, Cleveland Heights, OH (US)

(73) Assignee: Case Western Reserve University, Cleveland, OH (US)

( * ) Notice: Subject to any disclaimer, the term of this patent is extended or adjusted under 35 U.S.C. 154(b) by 1289 days.

This patent is subject to a terminal disclaimer.

(21) Appl. No.: 13/623,104

(22) Filed: Sep. 19, 2012

(65) Prior Publication Data

US 2013/0265047 A1  Oct. 10, 2013

Related U.S. Application Data

(63) Continuation-in-part of application No. 13/051,044, filed on Mar. 18, 2011, now Pat. No. 8,723,518.

(51) Int. Cl.
*G01R 33/56* (2006.01)
*G01R 33/48* (2006.01)
(Continued)

(52) U.S. Cl.
CPC .......... *G01R 33/56* (2013.01); *G01R 33/4828* (2013.01); *G01R 33/50* (2013.01); *G01R 33/56341* (2013.01)

(58) Field of Classification Search
CPC .... G01R 33/4828; G01R 33/50; G01R 33/56; G01R 33/56341; G01R 33/5608; G01R 33/448; G01R 33/441
(Continued)

(56) References Cited

U.S. PATENT DOCUMENTS

| 4,734,646 A | 3/1988 | Shenoy et al. |
| 5,387,866 A * | 2/1995 | Dumoulin ............... G01R 33/50 324/300 |

(Continued)

FOREIGN PATENT DOCUMENTS

| CN | 1636508 A | 7/2005 |
| CN | 101208610 A | 6/2008 |

(Continued)

OTHER PUBLICATIONS

Doneva, et al., Accelerated MR Parameter Mapping Using Compressed Sensing with Model-Based Sparsifying Transform, Proc. Intl. Soc. Mag. Reson. Med., 2009, 17:2812.

(Continued)

*Primary Examiner* — Rishi R Patel
(74) *Attorney, Agent, or Firm* — Quarles & Brady LLP

(57) ABSTRACT

Apparatus, methods, and other embodiments associated with NMR fingerprinting are described. One example NMR apparatus includes an NMR logic configured to repetitively and variably sample a (k, t, E) space associated with an object to acquire a set of NMR signals. Members of the set of NMR signals are associated with different points in the (k, t, E) space. Sampling is performed with t and/or E varying in a non-constant way. The varying parameters may include flip angle, echo time, RF amplitude, and other parameters. The NMR apparatus may also include a signal logic configured to produce an NMR signal evolution from the NMR signals, and a characterization logic configured to characterize a resonant species in the object as a result of comparing acquired signals to reference signals.

30 Claims, 13 Drawing Sheets

(51) Int. Cl.
*G01R 33/563* (2006.01)
*G01R 33/50* (2006.01)

(58) Field of Classification Search
USPC .................................................. 324/300–322
See application file for complete search history.

(56) References Cited

U.S. PATENT DOCUMENTS

| | | | |
|---|---|---|---|
| 5,500,592 A | | 3/1996 | Bottomley |
| 5,903,150 A | * | 5/1999 | Roznitsky .......... G01R 33/3657 324/318 |
| 6,392,408 B1 | | 5/2002 | Barrall et al. |
| 7,366,560 B2 | | 4/2008 | Taicher et al. |
| 7,642,775 B2 | | 1/2010 | Katscher et al. |
| 8,723,518 B2 | | 5/2014 | Seiberlich et al. |
| 9,097,781 B2 | * | 8/2015 | Griswold .......... G01R 33/5612 |
| 2004/0189296 A1 | | 9/2004 | Sun et al. |
| 2004/0260173 A1 | * | 12/2004 | Salerno .............. G01R 33/5601 600/420 |
| 2005/0060112 A1 | | 3/2005 | Schafer et al. |
| 2007/0063702 A1 | | 3/2007 | Gerald, II et al. |
| 2007/0224696 A1 | * | 9/2007 | Honkonen .......... G01R 33/465 436/173 |
| 2008/0077006 A1 | | 3/2008 | Katscher et al. |
| 2008/0197842 A1 | | 8/2008 | Lustig |
| 2008/0278159 A1 | | 11/2008 | Park |
| 2008/0284433 A1 | | 11/2008 | Kraus, Jr. et al. |
| 2008/0309337 A1 | | 12/2008 | Gerald, II et al. |
| 2009/0136104 A1 | * | 5/2009 | Hajian .................. G01R 33/56 382/128 |
| 2009/0232410 A1 | | 9/2009 | Dahnke et al. |
| 2010/0215239 A1 | | 8/2010 | Assaf |
| 2010/0321017 A1 | | 12/2010 | Pines et al. |
| 2011/0140696 A1 | | 6/2011 | Yu |
| 2012/0001631 A1 | | 1/2012 | Espy et al. |
| 2012/0035851 A1 | * | 2/2012 | Romero .................. G01V 3/32 702/8 |
| 2013/0099786 A1 | | 4/2013 | Huang et al. |
| 2014/0232399 A1 | | 8/2014 | Griswold et al. |
| 2014/0266199 A1 | | 9/2014 | Griswold et al. |

FOREIGN PATENT DOCUMENTS

| | | |
|---|---|---|
| JP | H03109040 A | 5/1991 |
| JP | H07200300 A | 8/1995 |
| JP | 2009014700 A | 1/2009 |
| JP | 2012048706 A | 3/2012 |

OTHER PUBLICATIONS

Doneva, et al., Compressed Sensing Reconstruction for Magnetic Resonance Parameter Mapping, Magnetic Resonance in Medicine, 2010, 64:1114-1120.

Petzschner, et al., Fast MR Parameter Mapping Using k-t Principal Component Analysis, Magnetic Resonance in Medicine, 2011, 66(3):706-716.

Twieg, et al., Parsing Local Signal Evolution Directly From a Single-Shot MRI Signal: A New Approach for fMRI, Magnetic Resonance in Medicine, 2003, 50:1043-1052.

PCT International Search Report, PCT/US2013/060681, dated Jan. 21, 2014.

"Courses in Experimental Chemistry 5, NMR", 4th Edition, Apr. 25, 1994, pp. 32-41, published by Maruzen Co., Ltd., Japan [No English Language Translation Available].

Ma, et al., MR Fingerprinting (MRF): A Novel Quantitative Approach to MRI, Proc. Intl. Soc. Mag. Reson. Med., 2012, 20:288.

Ma, et al., Magnetic Resonance Fingerprinting, Nature, 2013, 495:187-192.

McKenzie, et al., Analysis of Complex Mixtures Using High-Resolution Nuclear Magnetic Resonance Spectroscopy and Chemometrics, Progress in Nuclear Magnetic Resonance Spectroscopy, 2011, 59:336-359.

European Patent Office, Extended European Search Report, Application No. 13838364.1, dated Feb. 8, 2017.

Japan Patent Office, Office Action for application 2017-181972, dated Jun. 20, 2018, with associate translation.

* cited by examiner

NUCLEAR MAGNETIC RESONANCE (NMR) FINGERPRINTING

CROSS REFERENCE TO RELATED APPLICATIONS

This application is a continuation in part of the following U.S. patent application: "Nuclear Magnetic Resonance (NMR) Fingerprinting", application Ser. No. 13/051,044, filed Mar. 18, 2011, by inventors Seiberlich, et al, which is assigned to the present assignee.

BACKGROUND

Conventional magnetic resonance (MR) pulse sequences include a preparation phase, a waiting phase, and an acquisition phase that are configured to produce signals from which images can be made. The preparation phase determines when a signal can be acquired and determines the properties of the acquired signal. For example, a first pulse sequence may be designed to produce a T1-weighted signal at a first echo time (TE) while a second pulse sequence may be designed to produce a T2-weighted signal at a second TE. However, a lot of preparations and a lot of short waits, especially when compounded over multiple pulse sequences, can add up to a long time to collect a data set. These conventional pulse sequences are typically designed to provide qualitative results where data are acquired with various weightings or contrasts that highlight a particular parameter (e.g., T1 relaxation, T2 relaxation).

A conventional MR acquisition involves numerous repetitions of prepare/wait/acquire pulse sequences. For example, the first pulse sequence may be applied a large number of times to acquire T1 weighted signals for all voxels in a volume of interest (RoI) and then the second pulse sequence may be applied a large number of times to acquire T2 weighted signals for all the voxels in the RoI. Registering (e.g., aligning) the signals from these two acquisitions may be difficult.

When MR images are generated, they may be viewed by a radiologist and/or surgeon who interprets the qualitative images for specific disease signatures. The radiologist may examine multiple image types (e.g., T1-weighted, T2-weighted) acquired in multiple imaging planes to make a diagnosis. The radiologist or other individual examining the qualitative images may need particular skill to be able to assess changes from session to session, from machine to machine, and from machine configuration to machine configuration. Thus, the images are only as good as the image interpreter and all image based (e.g., qualitative) diagnoses end up being subjective.

Seen from a different point of view, conventional MR uses precise preparation time to create precise preparation conditions that facilitate acquiring precise signals from precise locations at precise points in time to make imprecise qualitative data sets. Conventional MR attempts to force the scanned contents (e.g., water, fat) to emit certain signals at certain times and then reconstructs data from these signals. Regardless of these shortcomings, conventional MR has served the clinical community well for many years.

Twieg proposed an approach involving compressed sensing where a model of a signal was used to reduce the total amount of data needed to reconstruct a parameter map and then to reconstruct an image. Similarly, Doneva et al. proposed random under-sampling to achieve compressed sensing. In the Doneva approach, a pixel will represent its true signal evolution plus aliased signal from other pixels. In one embodiment, the aliasing will only appear as added noise at a pixel. The noise will not have structure and will not correlate to the true signal evolution. The Doneva approach facilitates performing a relatively simple process like Orthogonal Matching Pursuit (OMP) to resolve the correct signal to support image reconstruction. OMP assumes the presence of a constrained dictionary of expected signal evolutions. OMP compares a received signal to the dictionary of signals to identify the signal that was most likely to come from a pixel.

Twieg, *Parsing local signal evolution directly from a single-shot MRI signal: a new approach for fMRI*, Magn Reson Med 2003, November; 50(5):1043-52, describes a single-shot MRI method that performs single-shot parameter assessment by retrieval from signal encoding. The Twieg method abandons the fundamental simplifying assumption used in conventional MRI methods, that the local intrinsic signal does not change its amplitude or phase during signal acquisition, even though these changes may be substantial, especially during longer periods used in single-shot image acquisitions. Twieg recognized that local decay and phase evolution occur and therefore modeled each signal datum as a sample from (k, t) space rather than k-space. Twieg adopted the view that each datum has its own location in a (k, t) space that also reflects another attribute (e.g., relaxation, decay), where t is the elapsed time. While Twieg anticipated improved accuracy and robustness due to the new signal model, intensive reconstruction computations limited Twieg's progress.

Doneva, et al, *Compressed sensing reconstruction for magnetic resonance parameter mapping*, Magnetic Resonance in Medicine, Volume 64, Issue 4, pages 1114-1120, October 2010, recognizes that different tissues in the human body can be distinguished in MRI by their intrinsic MR parameters including proton density, longitudinal (T1, spin-lattice) relaxation time, and transverse (T2, spin-spin) relaxation time. Doneva applies a learned dictionary to sparsify data and then uses a model based reconstruction for MR parameter mapping. Doneva identifies that "multiple relaxation components in a heterogeneous voxel can be assessed." However, Doneva uses an imaging based approach that relies on a library whose curves can, in one example, be characterized by equations of the form:

$$SE = 1 - 2e^{-t/Tx}$$

where:
SE is a signal evolution,
t is time, and
Tx is a single relaxation parameter.

In another, more general example, Doneva uses an imaging based approach that relies on a library whose curves can be characterized by:

$$SE = A + Be^{-t/C}$$

where A is a constant, B is a constant, t is time, and C is a single relaxation parameter.

Doneva pattern matches a received signal evolution to a curve stored in the library.

The Doneva library is limited to the idealized, single relaxation parameter curves because the preparation is specific and constrained by the fact that Doneva ultimately reconstructs an image from the acquired data. Thus, any variations in t appear to be constant or linear and any variations in a also appear to be constant or linear.

Twieg and Doneva appear to be limited to conventional imaging sequences that highlight only one or a few parameters. To the extent that Twieg or Doneva use any quantitative sequences, these sequences include an excitation and preparation scheme that generates a contrast between different tissues with different properties. However, the preparation fades over time until no more useful information can be acquired unless preparation is repeated. For example, after about 4-5 seconds, tissues subjected to an inversion recovery sequence designed for T1 contrast will have recovered to their equilibrium state and will yield no more signal. This short time limit compromises the ability to perform three dimensional imaging, imaging of moving targets, and so on. Additionally, Twieg and Doneva appear further limited to acquiring information, associated with one relaxation parameter at a time. Twieg and Doneva appear suited to collecting information about T1 relaxation, T2 relaxation, or one fixed combination of T1 and T2, but not both simultaneously. To the extent that Twieg and Doneva could acquire information about T1 and T2, the sensitivity to either would be constant through the acquisition.

BRIEF DESCRIPTION OF THE DRAWINGS

The accompanying drawings, which are incorporated in and constitute a part of the specification, illustrate various example systems, methods, and other example embodiments of various aspects of the invention. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

FIG. 10a illustrates an example acquisition sequence diagram. FIG. 10b) illustrates an example of FA and TR patterns.

FIG. 11a illustrates simulated signal evolution curves corresponding to four normal tissues of the brain. FIG. 11b illustrates one example of acquired signal evolution curves and its comparison to a dictionary. FIG. 11c illustrates $T_1$ and $T_2$ values retrieved from a matching algorithm.

FIG. 12a illustrates a T1 map (ms), FIG. 12b illustrates a T2 map (ms), FIG. 12c illustrates an off-resonance map (Hz), and FIG. 12d illustrates a proton density map retrieved.

DETAILED DESCRIPTION

Figure 1:
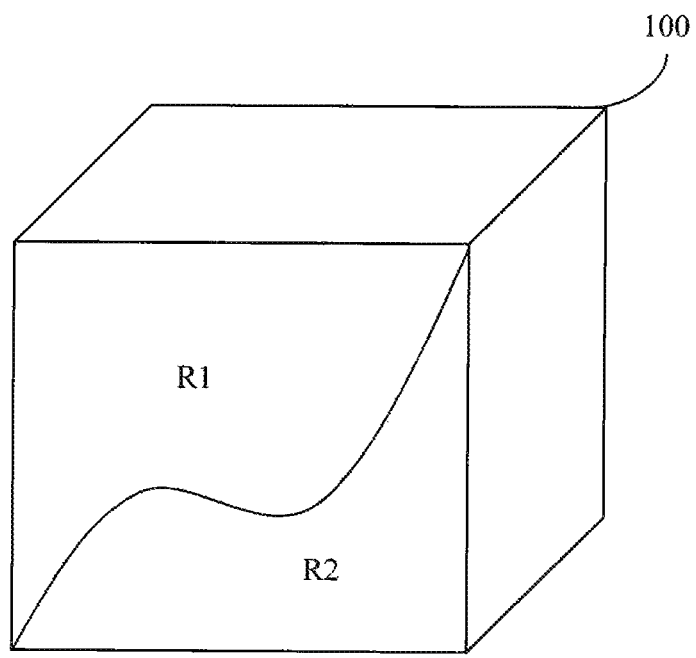
FIG. 1 illustrates a volume that contains two resonant species.

Example apparatus and methods employ a series of varied sequence blocks that produce different signal evolutions in different resonant species (e.g., tissues) to which the RF is applied. The term "resonant species", as used herein, refers to an item (e.g., water, fat, tissue, material) that can be made to resonate using NMR. By way of illustration, when example apparatus and methods apply RF energy to a volume that has both bone and muscle tissue, then both the bone and muscle tissue will produce an NMR signal. However the "bone signal" and the "muscle signal" will be different. The different signals can be collected over a period of time to identify a signal evolution for the volume. In one embodiment, resonant species in the volume can then be characterized by comparing the signal evolution to known evolutions. In one embodiment, the "known" evolutions may be, for example, simulated evolutions and/or previously acquired evolutions. Characterizing the resonant species can include identifying different properties of a resonant species (e.g., T1, T2, diffusion resonant frequency, diffusion coefficient, spin density, proton density). Additionally, other properties including, but not limited to, tissue types, materials, super-position of attributes (e.g., T1, T2) can be identified.

In one embodiment, characterizing the resonant species may be performed by comparing first information to second information. The first information may include the acquired NMR signals, the acquired signal evolution, or information derived from the acquired NMR signals or acquired signal evolution. The second information may include a stored signal evolution, a known signal evolution, a modeled signal evolution, information derived from stored signal evolutions, or information that is not a signal evolution. Deriving information from a signal evolution may include, for example, transforming a signal evolution, transforming two or more signal evolutions, combining signal evolutions, decomposing a signal evolution, decomposing two or more signal evolutions, and other mathematical or other transformations.

Comparing the first information to the second information may be performed in various ways including, but not limited to, pattern matching, selection, minimization of a cost function, and optimization. Pattern matching may include, but is not limited to, OMP, categorical sequence labeling, regression, clustering, classification, real value sequence labeling, parsing algorithms, Bayesian methods, Markov methods, ensemble learning methods, and template matching. Optimization may include, but is not limited to, least squares optimization, regularized least squares optimization, basis pursuit optimization, and matching pursuit optimization.

The result of the comparison may take different forms. In different embodiments, the result of the comparison may include, but is not limited to, an identification that the first information matches the second information, an identification that the first information matches the second information to within a tolerance, and an identification that there is a certain percent likelihood that the first information matches the second information. In other embodiments the result of the comparison may include, but is not limited to, an identification of T1 for a resonant species, an identification of T2 for a resonant species, an identification of a diffusion coefficient, an identification of a spin density, an identification of a resonance frequency (e.g., chemical shift) and an identification of a proton density. In another embodiment, the comparison may include identifying the strength of a magnetic field (e.g., B0, B1) or may include identifying the strength of a gradient field. In yet another embodiment, the result of the comparison may identify a tissue type (e.g., brain, brain tumor) or may identify a material. Thus, the comparison may produce different results. In one embodiment, multiple results may be provided. For example, a weighted list of likely materials may be provided. In another example, multiple probabilities may be provided.

Example apparatus and methods do not define what the signals produced by the resonant species must be, only that the signals be different between different resonant species being examined. Unlike conventional systems, the different NMR signals may not have constant signal strength or phase. Since tissues or other materials may produce different signals, in one embodiment, the process of characterizing the tissues or other materials is reduced to pattern recognition in the signal time course. The pattern recognition may be performed using, for example, different variations of Orthogonal Matching Pursuit (OMP). In one embodiment, pattern matching may lead to a conclusion that an acquired signal evolution matches a known signal evolution to within a desired tolerance. In another embodiment, pattern matching may identify a probability that a known signal evolution matches the acquired signal evolution. In another embodiment, comparing may lead to a conclusion that an acquired signal evolution or information that is a function of an acquired signal evolution matches a known signal evolution or information that is a function of one or more known signal evolutions to within a desired tolerance. In yet another embodiment, comparing may identify a probability that an acquired signal evolution or information that is a function of an acquired signal evolution matches a known signal evolution or information that is a function of one or more known signal evolutions. Example apparatus and methods facilitate maximizing contrast between resonant species without ignoring resonant species that may be in the volume or object. Thus, NMR fingerprinting involves applying a series of varied sequence blocks that generates a particular signal evolution signature (e.g., fingerprint) that is specific for a particular combination of parameters and resonant species in a volume. Processing performed on received signals does not involve conventional reconstruction, but rather involves analyzing the received NMR signals or determined signal evolution in light of known information including, but not limited to, signal evolutions, information derived from signal evolutions, and other information.

Larger objects like human bodies are made up of smaller objects like arms and legs and hips. The smaller objects are in turn made up of smaller parts like skin, muscle, fat, bone, tendon, and prosthetics. These smaller parts are in turn made up of even smaller things like water and minerals. The water and minerals are themselves made up of even smaller things (e.g., hydrogen, oxygen) which in turn are made up of even smaller things (e.g., electrons orbiting a nucleus). The nucleus may include a proton that exhibits "spin". A human body has a large number of protons and thus a large number of spins.

In the presence of a magnetic field, some of the spins will align in one direction (e.g., N/S) with respect to that magnetic field while other spins will align in an opposite direction (e.g., S/N) with respect to that magnetic field. Conventional MRI manipulates the magnetic field so that a net alignment in one direction is achieved. Conventional MRI further manipulates the magnetic field so that local differences in the field are achieved to allow spatial encoding. For example, x, y, and z gradients may be applied to create local variations in the larger magnetic field. The local variations allow the excitation of some spins without the excitation of other spins. Selective excitation is possible because of the Larmor relationship between magnetic fields and spins. The Larmor relationship describes how the frequency at which spins accept RF energy is related to the magnetic field in which the spins are located.

With the local variations created, RF energy may be applied to selected sets of spins associated with a local variation to make those spins behave in a certain way. For example, spins may be forced into a high energy state and forced away from their default alignment. When the RF energy is removed, the spins may return or may be forced to return to their default alignment. Different spins may return to their default alignment at different rates. Similarly, spins may return to their default alignment for different reasons. As the spins return from the forced alignment to the natural alignment, the spins produce a signal that can be detected for a short period of time. Conventional systems are limited by this short period of time and must, therefore, constantly repeat the process that tips the spins out of one alignment and into another alignment from which they can return and produce signal.

Like conventional MR, NMR fingerprinting manipulates the magnetic field and manipulates the application of RF energy at different frequencies. However, example apparatus and methods use a comprehensive inquisitive signal acquisition approach. In one embodiment, NMR fingerprinting employs pseudo-random routines that allow a volume to produce the signal(s) the volume is going to produce in response to a variety of changing conditions created by a variety of changing applications of RF energy. In one embodiment, NMR fingerprinting then compares a signal that evolves from the received signals to known signals received from other acquisitions at other times under similar conditions or to a set of simulated expected or predicted curves. If the received signal evolution matches or can be fit to within a threshold of a known, simulated, or predicted signal evolution, then the volume that generated the signal evolution likely holds the same number, type, and mixture of spins as the volume that produced that matched or fitted signal evolution. If material or tissue properties are available for the fitted or matched signal evolution, then conventional property determinations may be skipped. More generally, first information associated with NMR signals acquired in response to NMR fingerprinting excitation is compared to second information associated with reference responses to NMR fingerprinting excitation to characterize a property of a material subjected to the NMR fingerprinting excitation.

The frequency at which water in a volume will accept RF energy is determined by the magnetic field in which the water is located. The frequency can be computed when the magnetic field is known. The frequency at which fat in the same volume will accept RF energy is also determined by the magnetic field in which the fat is located. This frequency can also be computed when the magnetic field is known. Thus, applying multiple frequencies can induce multiple resonant species to resonate. Applying the multiple frequencies under a series of different conditions at different times can cause the resonant species to resonate in different ways. Additionally, applying the multiple frequencies under different conditions at different times can cause the resonant species to resonate and relax in different ways. The different resonations and different relaxations may yield a unique signal evolution for a combination of resonant species. Since the frequency is determined by the magnetic field, the magnetic field may be determined when the frequency is known by analyzing received signal in light of reference signals.

If a volume only has water, then the volume will only produce one signal. If the volume only has fat, then the volume will also only produce one signal, but it will be a different signal. Different amounts of fat and water in the same volume will yield different signals. The combination of signals acquired under different conditions may yield nearly infinitely unique signal evolutions. While the human body is a complicated thing, from a certain point of view it is not that complicated. Every volume in a human body can only hold a finite set of things arranged in a finite set of ways. Over time, a comprehensive library of reference information including, but not limited to, signal evolutions associated with many of the most relevant combinations of resonant species may be acquired and be available to NMR fingerprinting apparatus. The library may store signals that may be referred to as baseline signatures or known signal evolutions. In different embodiments, the library may store simulated and/or predicted signal evolutions. Thus in different examples, "known" signal evolutions may include previously acquired signal evolutions and/or simulated signal evolutions. Additionally, a dictionary or other reference store may include information that is a function of a signal evolution. For example, two signal evolutions may be combined into a different piece of information. Similarly, a single signal evolution may be transformed into a different piece of information. Both signal evolutions and information derived from, computed from, or that is otherwise a function of a signal evolution may be stored. Additionally, in one embodiment, a dictionary or other reference store may include information that did not start as a signal evolution or that is not derived from a signal evolution.

In one embodiment, baseline signatures can be associated with materials that were analyzed solely for producing baseline signatures. For example, a beaker of water may be analyzed for a period of time using varied sequence blocks that produce a signal evolution. Similarly, a beaker of fat, a bone, a prosthetic hip, or other things that resonate may be analyzed, and signal evolutions retrieved from these items in response to applying selected combinations of varied sequence blocks over time under selected combinations of varied conditions. These signals may be used as baseline signatures for other objects that are analyzed.

In another embodiment, baseline signatures can be acquired from the object being analyzed. Volumes in the object may be imaged using a conventional technique and may also be subjected to NMR fingerprinting. For example, 1% of a leg may be imaged conventionally and also processed using example NMR fingerprinting to establish baseline signatures for bone and other tissues. The 1% may be processed to calibrate an apparatus or method. With the calibration and baseline signatures acquired, the remaining 99% may be analyzed using NMR fingerprinting that relies on the baseline signatures established by processing the 1%. Even if some volumes produce a signal for which no fingerprinting match can be made, those volumes may simply be analyzed using a conventional approach. Thus, in one embodiment, a combination conventional and fingerprinting approach may be used to establish signatures and, for calibration.

Using pattern matching to compare acquired signal evolutions to known, signal evolutions may include analyzing a cross-correlation between signal evolutions of different tissues acquired using sequence blocks having different parameters. Ideally, a signal evolution would fit to exactly one member of the multi-dimensional set of known evolutions. However, a signal evolution may have relationships with more than one reference signal. Thus, in one embodiment, a result of comparing a signal evolution to a reference signal may be an identification of a reference signal with which the signal evolution is related and a measurement characterizing the relationship. For example, a signal evolution may be identified as matching a reference signal to within a desired tolerance. Similarly, a signal evolution may be identified as being x % likely to match a reference signal. In another embodiment, a signal evolution may be identified as being a weighted sum of a number of reference signals. One dimension of the multi-dimensional set could, for example, be associated with a first set of acquisition and/or excitation parameters while a second dimension of the multi-dimensional set could, for example, be associated with a second set of excitation and/or acquisition parameters. Over time, the members of the multi-dimensional set could be adapted based on fits that are achieved from live data. Over time, sequence blocks and/or combinations of sequence blocks that yield a more identity-matrix like result may be favored over sequence blocks that yield a matrix with more off-diagonal contributions. This adaptation of sequence blocks and/or series of sequence blocks based on observed results may contribute, for example, to calibrating a particular NMR apparatus for MR fingerprinting.

The following includes definitions of selected terms employed herein. The definitions include various examples and/or forms of components that fall within the scope of a term and that may be used for implementation. The examples are not intended to be limiting. Both singular and plural forms of terms may be within the definitions.

References to "one embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

"Computer-readable medium", as used herein, refers to a non-transitory medium that stores signals, instructions and/or data. A computer-readable medium may take forms, including, but not limited to, non-volatile media, and volatile media. Non-volatile media may include, for example, optical disks, magnetic disks, and so on. Volatile media may include, for example, semiconductor memories, dynamic memory, and so on. Common forms of a computer-readable medium may include, but are not limited to, a floppy disk, a flexible disk, a hard disk, a magnetic tape, other magnetic medium, an ASIC, a CD, other optical medium, a RAM, a ROM, a memory chip or card, a memory stick, and other media from which a computer, a processor or other electronic device can read.

"Logic", as used herein, includes but is not limited to hardware, firmware, software in execution on a machine, and/or combinations of each to perform a function(s) or an action(s), and/or to cause a function or action from another logic, method, and/or system. Logic may include a software controlled microprocessor, a discrete logic (e.g., ASIC), an analog circuit, a digital circuit, a programmed logic device, a memory device containing instructions, and so on. Logic may include one or more gates, combinations of gates, or other circuit components. Where multiple logical logics are described, it may be possible to incorporate the multiple logical logics into one physical logic. Similarly, where a single logical logic is described, it may be possible to distribute that single logical logic between multiple physical logics.

An "operable connection", or a connection by which entities are "operably connected", is one in which signals, physical communications, and/or logical communications may be sent and/or received. An operable connection may include a physical interface, an electrical interface, and/or a data interface. An operable connection may include differing combinations of interfaces and/or connections sufficient to allow operable control. For example, two entities can be operably connected to communicate signals to each other directly or through one or more intermediate entities (e.g., processor, operating system, logic, software). Logical and/or physical communication channels can be used to create an operable connection.

"Signal", as used herein, includes but is not limited to, electrical signals, optical signals, analog signals, digital signals, data, computer instructions, processor instructions, messages, a bit, a bit stream, or other means that can be received, transmitted and/or detected.

"User", as used herein, includes but is not limited to one or more persons, software, computers or other devices, or combinations of these.

Some portions of the detailed descriptions that follow are presented in terms of algorithms and symbolic representations of operations on data bits within a memory. These algorithmic descriptions and representations are used by those skilled in the art to convey the substance of their work to others. An algorithm, here and generally, is conceived to be a sequence of operations that produce a result. The operations may include physical manipulations of physical quantities. Usually, though not necessarily, the physical quantities take the form of electrical or magnetic signals capable of being stored, transferred, combined, compared, and otherwise manipulated in a logic, and so on. The physical manipulations create a concrete, tangible, useful, real-world result.

It has proven convenient at times, principally for reasons of common usage, to refer to these signals as bits, values, elements, symbols, characters, terms, numbers, and so on. It should be borne in mind, however, that these and similar terms are to be associated with the appropriate physical quantities and are merely convenient labels applied to these quantities. Unless specifically stated otherwise, it is appreciated that throughout the description, terms including processing, computing, determining, and so on, refer to actions and processes of a computer system, logic, processor, or similar electronic device that manipulates and transforms data represented as physical (electronic) quantities.

Example methods may be better appreciated with reference to flow diagrams. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be required to implement an example methodology. Blocks may be combined or separated into multiple components. Furthermore, additional and/or alternative methodologies can employ additional, not illustrated blocks.

FIG. 1 illustrates a volume 100 (e.g., voxel) that contains two resonant species R1 and R2. R1 and R2 may have different properties (e.g., relaxation parameters, non-relaxation parameters). For example, the $T1_R1$ may be less than T1 while $T2_R1$ may be greater than $T2_R2$. In another example, a spin density for R1 may differ from a spin density for R2. Conventional systems may acquire a T1 weighted data set and then acquire a T2 weighted data set and then register the data sets. Example apparatus and methods apply RF energy in a series of varied sequence blocks that cause volume 100 to simultaneously produce different NMR signals from both R1 and R2. A signal evolution can be produced from these simultaneously produced different NMR signals. Information including relaxation parameters (e.g., T1, T2), and non-relaxation parameters (e.g., diffusion coefficient, spin density, proton density, magnetic field strength) can be determined from the signal evolution by comparing the acquired signal to reference information. In one embodiment, the comparing may include pattern matching to other signal evolutions for which relaxation parameters are known. The resonant species R1 and R2 can then be characterized. Since different tissues have different known properties (e.g., relaxation parameters, non-relaxation parameters), different tissues can be identified using the characterization. While two resonant species are illustrated, one skilled in the art will appreciate that a volume may include a greater or lesser number of resonant species. Therefore, example methods and apparatus apply more generally to a volume having multiple resonant species.

Figure 2:
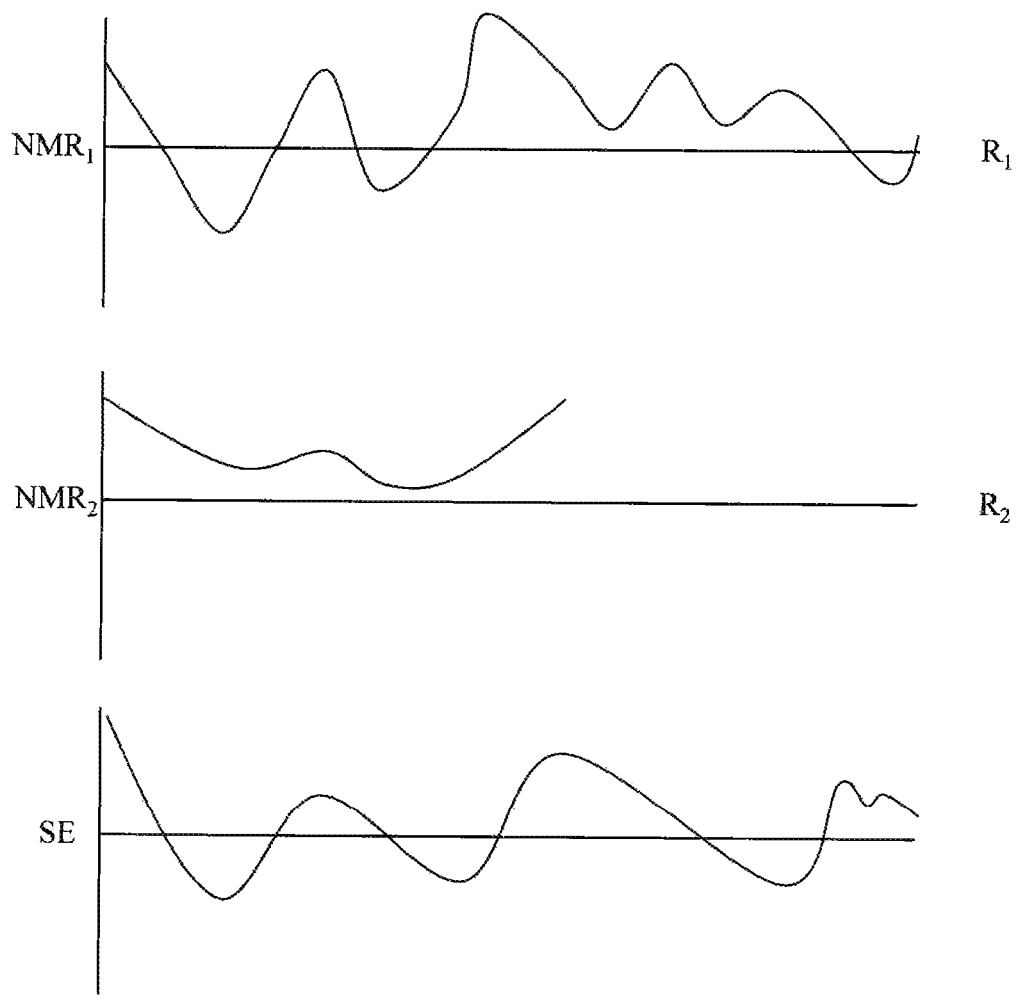
FIG. 2 illustrates two individual NMR signals received from two resonant species and a signal evolution derived from the two individual NMR signals.

FIG. 2 illustrates plots of two individual NMR signals $NMR_1$ and $NMR_2$ received from the two resonant species R1 and R2 in volume 100. $NMR_1$ includes data points generated by R1 under different conditions at different times. $NMR_2$ includes data points generated by R2 under the different conditions at the different times. Signal evolution SE results from $NMR_1$ and $NMR_2$ being generated and acquired simultaneously. The space from which the data points for $NMR_1$ and $NMR_2$ is acquired may be referred to as a (k, t, E) space, where in different examples, E refers to (T1, T2, D), (T1, T2, D, . . . ), (T1, T2, . . . ) where D refers to diffusion relaxation. In one example, both t and E may be non-linear. In another example, both t and E may be pseudo-random. Once again, while two plots associated with two resonant species are illustrated, one skilled in the art will appreciate that a volume may include a greater or lesser number of resonant species and thus may produce a greater or lesser number of signals. Therefore, example methods and apparatus apply more generally to a volume having one or more resonant species.

Figure 3:
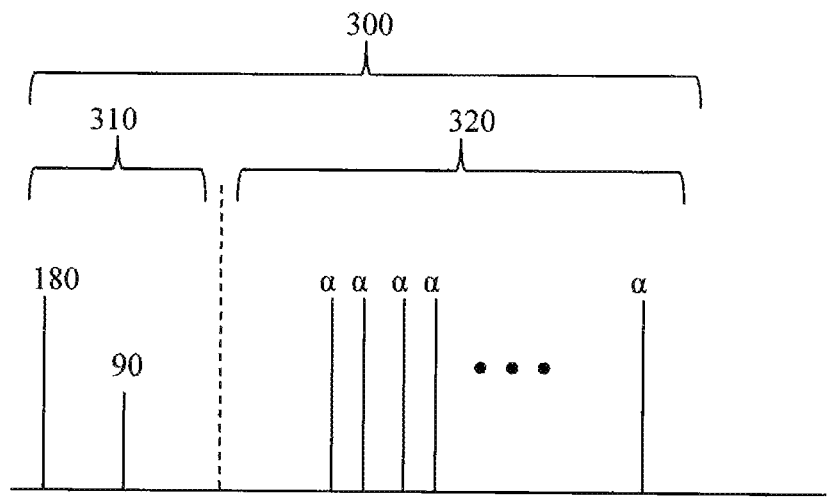
FIG. 3 compares and contrasts conventional sequence blocks to example sequence blocks.
Figure 3:
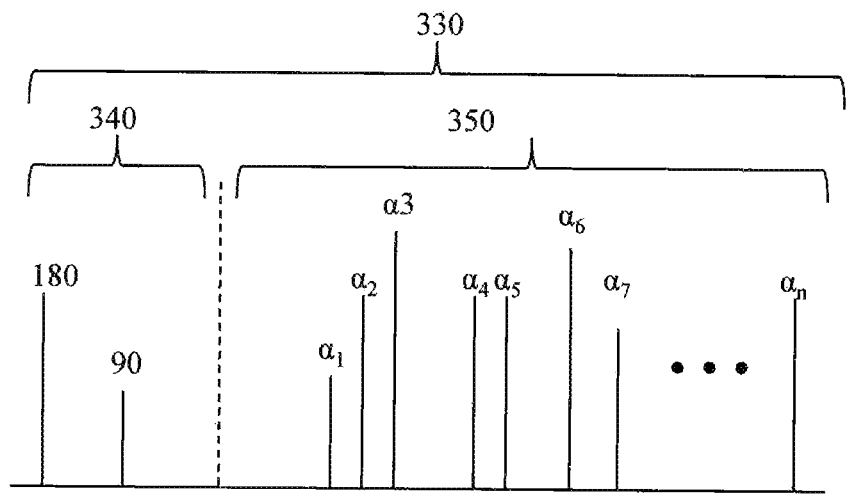

FIG. 3 compares and contrasts conventional sequence blocks to example sequence blocks. Sequence block 300 includes a preparation phase 310 and an acquisition phase 320. During acquisition phase 320, multiple acquisitions using the same flip angle and the same interval between acquisitions may be performed. Acquisition phase 320 resembles the Doneva approach, which acquires data from a (k, t) space, where t varies either constantly or linearly. The constant variation facilitates acquiring signal with constant amplitude and phase as required for conventional image reconstruction.

Sequence block 330 also includes a phase 340 and an acquisition phase 350. Notice that acquisition phase 350 is much longer than acquisition phase 320. Unlike acquisition phase 320 where parameters are either fixed or vary linearly, in acquisition phase 350 the parameters may vary widely, either non-linearly, randomly, and/or pseudo-randomly. Parameters that may vary include, but are not limited to, echo time, flip angle, phase encoding, and others. Note also that while phase 340 may, in some examples, be a preparation phase or preparation-like phase, that phase 340 does not necessarily perform a conventional preparation.

Figure 9:
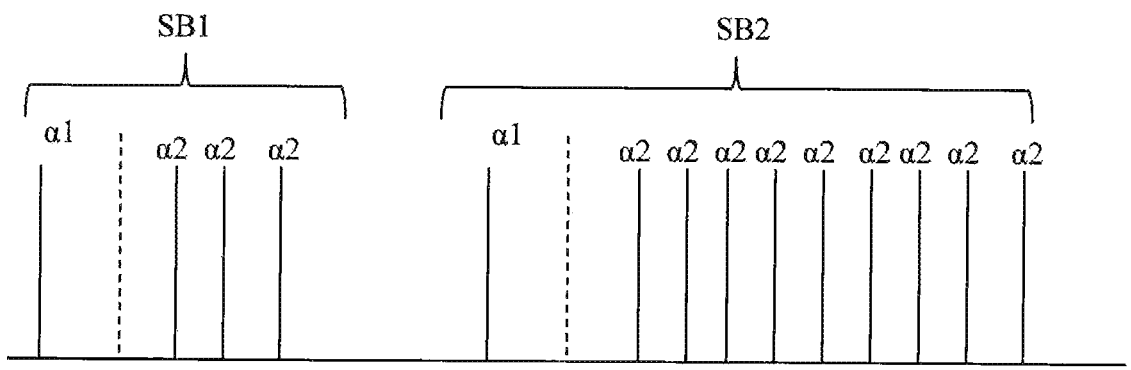
FIG. 9 illustrates another example set of sequence blocks.

FIG. 9 illustrates another example set of sequence blocks. In FIG. 9, a first sequence block SB1 has a first alpha pulse α1 and a series of identical α2 pulses. In FIG. 9, a second sequence block SB2 has the same first alpha pulse α1 and a different series of identical α2 pulses. The phase may be the same for the α2 pulses. Thus, in this example, the only difference between members of the set of sequence blocks is the number of α2 pulses. One skilled in the art will appreciate that other sets of sequence blocks may be employed.

Figure 4:
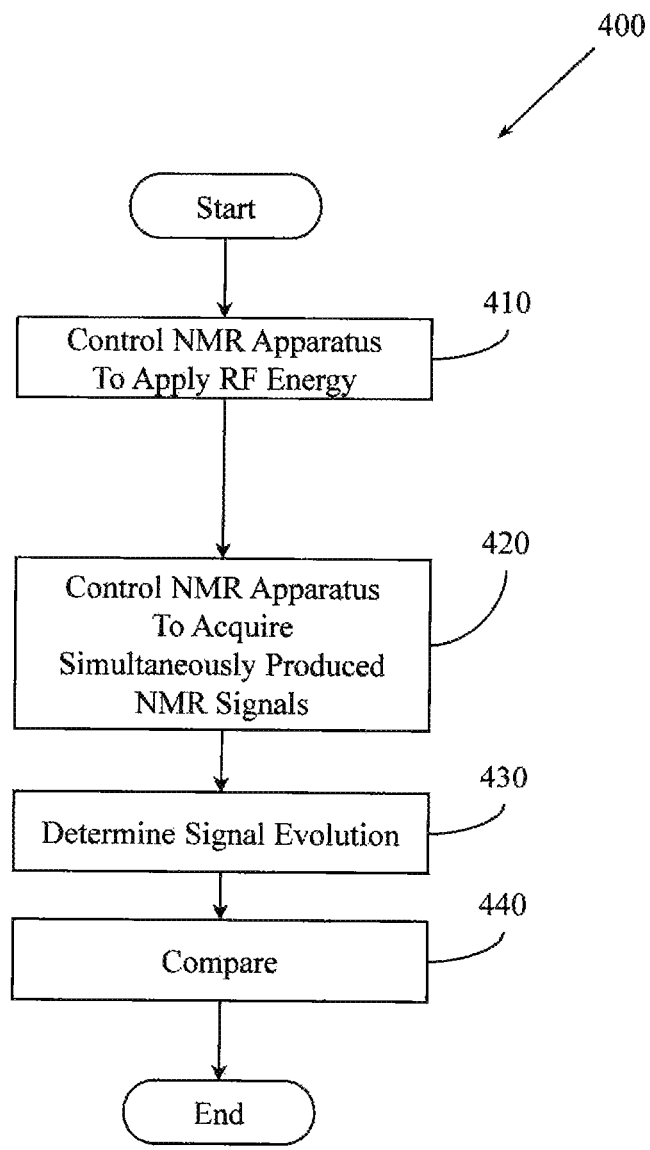
FIG. 4 illustrates an example method associated, with NMR fingerprinting.

FIG. 4 illustrates a method 400 associated with NMR fingerprinting. Method 400 includes, at 410, controlling an NMR apparatus to apply RF energy to a volume in an object. The volume may contain one or more resonant species. In one embodiment, the object may be a human and thus resonant species may include, but are not limited to, tissue, fat, water, hydrogen, and prosthetics.

The RF energy may be applied in a series of variable sequence blocks. Sequence blocks may vary in a number of parameters including, but not limited to, echo time, flip angle, phase encoding, diffusion encoding, flow encoding, RF pulse amplitude, RF pulse phase, number of RF pulses, type of gradient applied between an excitation portion of a sequence block and a readout portion of a sequence block, number of gradients applied between an excitation portion of a sequence block and a readout portion of a sequence block, type of gradient applied between a readout portion of a sequence block and an excitation portion of a sequence block, number of gradients applied between a readout portion of a sequence block and an excitation portion of a sequence block, type of gradient applied during a readout portion of a sequence block, number of gradients applied during a readout portion of a sequence block, amount of RF spoiling, and amount of gradient spoiling. In different embodiments two, three, four, or more parameters may vary between sequence blocks. In different embodiments, the number of parameters varied between sequence blocks may itself vary. For example, A1 (sequence block 1) may differ from A2 in five parameters, A2 may differ from A3 in seven parameters, and A3 may differ from A4 in two parameters. One skilled in the art will appreciate that there are a nearly infinite number of series of sequence blocks that can be created by varying this large number of parameters. In one embodiment, a series of sequence blocks is crafted so that the series have different amounts (e.g., 1%, 2%, 5%, 10%, 50%, 99%, 100%) of unique sequence blocks as defined by their varied parameters. In different embodiments, a series of sequence blocks may include more than ten, more than one hundred, more than one thousand, more than ten thousand, and more than one hundred thousand sequence blocks. In one example, the only difference between consecutive sequence blocks may be the number of α2 pulses as illustrated in FIG. 9.

The RF energy applied during a sequence block is configured to cause different individual resonant species to simultaneously produce individual NMR signals. Unlike conventional systems, at least one member of the series of variable sequence blocks will differ from at least one other member of the series of variable sequence blocks in at least N sequence block parameters, N being an integer greater than one. One skilled in the art will grasp that the signal content of a signal evolution may vary directly with N. Thus, as more parameters are varied, a potentially richer signal is retrieved. Conventionally, a signal that depends on a single parameter is desired and required to facilitate imaging. Here, acquiring signals with greater information content facilitates producing more distinct and identifiable signal evolutions.

In one embodiment, the NMR apparatus may be controlled at 410 to apply members of the series of variable sequence blocks according to a partially random acquisition plan configured to under-sample the object at an under-sampling rate R. In different embodiments, rate R may be, for example, two, four, or greater.

Method 400 also includes, at 420, controlling the NMR apparatus to acquire the simultaneously produced individual NMR signals. Unlike conventional systems where the time during which, an NMR signal can be acquired is severely limited (e.g., 4-5 seconds), the NMR apparatus can be controlled to acquire NMR signal for significantly longer periods of time. For example, the NMR apparatus can be controlled to acquire signal for up to ten seconds, for up to twenty seconds, for up to one hundred seconds, or longer. NMR signals can be acquired for longer periods of time because signal information content remains viable for longer periods of time in response to the series of varied RF energy applied at 410. In different embodiments, the information content in the signal evolution may remain above an information content threshold for at least, five seconds, for at least ten seconds, for at least sixty seconds, or for longer. An information content threshold may describe, for example, the degree to which a subsequent signal acquisition includes information that can be retrieved and that differs from information acquired in a previous signal acquisition. For example, a signal that has no retrievable information would likely fall below an information content threshold while a signal with retrievable information that differs from information retrieved from a previous signal would likely be above the information content threshold.

Method 400 also includes, at 430, controlling the NMR apparatus to determine a signal evolution from the acquired NMR signals. Determining the signal evolution may include storing (k, t, E) space data points acquired during action 420. While an individual sequence block may yield a single point in (k, t, E) space, the signal evolution is determined by the series of variable sequence blocks. Over time, series of variable sequence blocks that yield particularly useful signal evolutions may be identified.

In one embodiment, the simultaneously produced signals are acquired at 420 over a first period of time and the signal evolution is determined at 430 over a second period of time. In different embodiments the first period of time may be ten seconds or longer, sixty seconds or longer, and even longer. Additionally, in different embodiments, the second period of time may be ten seconds or longer, sixty seconds or longer, and even longer.

Method 400 also includes, at 440, controlling the NMR apparatus to compare first information to reference information. The first information may be, for example, the signal evolution. The reference information may be, for example, known, stored, simulated, and/or predicted signal evolutions. The reference information may also include information that is produced as a function of a known, stored, simulated, or predicted signal evolution. The reference information may be produced by, for example, transforming a signal evolution, combing signal evolutions, decomposing signal evolutions, and other operations. In different examples, the "stored" signal evolutions may include previously acquired signals, simulated signals, or both. In one embodiment, the stored signal evolutions are associated with signals not acquired from the object while in another embodiment the stored signal evolutions are associated with signals acquired from the object. In one embodiment, the stored signals may be associated with signals acquired from the object being analyzed and signals not acquired from the object being analyzed.

The stored signals and information derived from reference signal evolutions may be associated with a potentially very large data space. Thus, one skilled in the art will appreciate that the stored signal evolutions and information derived from reference signal evolutions may include signals outside the set of signal evolutions characterized by:

$$SE = A - Be^{-t/C}$$

where:
SE is a signal evolution,
A is a constant,
B is a constant,
t is time, and
C is a single relaxation parameter.

Indeed, one skilled in, the art will appreciate that the very large data space for signal evolutions can be partially described by:

$$SE = \prod_{i=1}^{N_A} \sum_{j=1}^{N_{RF}} R_i(\alpha) R_{RF_{ij}}(\alpha, \varphi) R(G) E_i(T1, T2, D)$$

where:
SE is a signal evolution,
$N_A$ is a number of sequence blocks,
$N_{RF}$ is a number of RF pulses in a sequence block,
α is a flip angle,
φ is a phase angle,
Ri(α) is a rotation due to off resonance,
$R_{RF_{ij}}(\alpha,\varphi)$ is a rotation due to RF differences,
R(G) is a rotation due to a gradient,
T1 is spin-lattice relaxation,
T2 is spin-spin relaxation,
D is diffusion relaxation, and
$E_i(T1,T2,D)$ is associated with magnetization changes.

While $E_i(T1,T2,D)$ is provided as an example, one skilled in the art will appreciate that in different embodiments, $E_1(T1,T2,D)$ may actually be $E_i(T1,T2,D, \ldots)$, or $E_i(T1, T2, \ldots)$.

In one example, the summation on j could be replaced by a product on j, e.g.:

$$SE = \prod_{i=1}^{N_A} \prod_{j=1}^{N_{RF}} R_i(\alpha) R_{RF_{ij}}(\alpha, \varphi) R(G) E_i(T1, T2, D).$$

In NMR, MRI, or ESR (electron spin resonance), a Bloch equation is a member of a set of macroscopic equations that are used to calculate the nuclear magnetization $M=(M_x, M_y, M_z)$ as a function of time when relaxation times $T_1$ and $T_2$ are present. These phenomenological equations were introduced by Felix Bloch and may also be referred to as the equations of motion of nuclear magnetization. One skilled in the art will appreciate that in one embodiment Ri(α), $R_{RF_{ij}}$ (α,φ), and R(G) may be viewed as Bloch equations.

While FIG. 4 illustrates various actions occurring in serial, it is to be appreciated that various actions illustrated in FIG. 4 could occur substantially in parallel. By way of illustration, a first process could control applying RF energy, a second process could control acquiring NMR signals and determining a signal evolution, and a third, process could perform comparisons. While three processes are described, it is to be appreciated that a greater and/or lesser number of processes could be employed.

Figure 5:
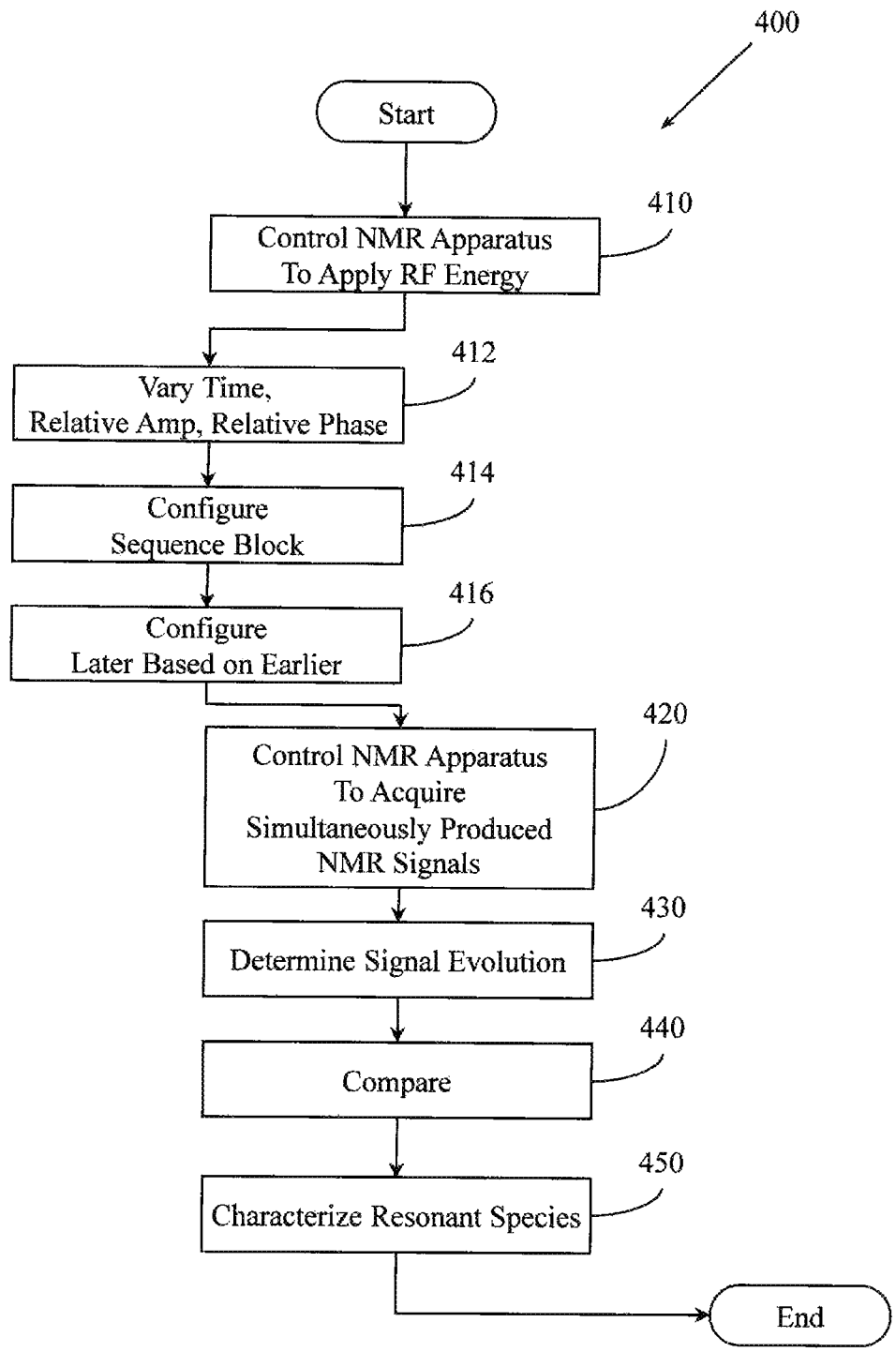
FIG. 5 illustrates an example method associated with NMR fingerprinting.

FIG. 5 illustrates another embodiment of method 400 (FIG. 4). This embodiment includes actions 410, 420, 430, and 440. However, this embodiment also includes actions 412, 414, 416, and 450.

This embodiment of method 400 includes, at 412, controlling the NMR apparatus to vary one or more of, the amount of time between sequence blocks, the relative amplitude of sequence blocks, and the relative phase of sequence blocks. Thus, not only can the individual parameters (e.g., flip angle, phase) be varied between sequence blocks, but the times between sequence blocks and other differences between sequence blocks can be varied. This facilitates creating additional signal content in the signal evolution.

This embodiment of method 400 also includes, at 414, controlling the NMR apparatus to configure a member of the series of variable sequence blocks as one of, a TrueFISP pulse sequence, a FLASH pulse sequence, and a TSE pulse sequence. Action 414 illustrates that a set of sequence blocks is not necessarily the same thing as a conventional pulse sequence. A sequence block differs from a conventional pulse sequence for at least the reason that non-linearly varying Δt and ΔE, which produce NMR signals in (k, t, E) space having non-constant amplitudes and phases are encouraged, not prohibited.

This embodiment of method 400 also includes, at 416, controlling the NMR apparatus to configure a later member of the series of variable sequence blocks based, at least in part, on an NMR signal acquired in response to applying an earlier member of the series of variable sequence blocks. Thus, this embodiment of method 400 is an adaptive method where the order of members of the series of varied sequence blocks may not be known ahead of time. Instead, as data points in (k, t, E) space are acquired, and as a signal evolves, decisions concerning different sequence blocks and different sets of parameters to vary may be made. By way of illustration, a first number of data points in (k, t, E) space and an evolving signal may be leading towards one relaxation parameter determination and away from another relaxation parameter determination. Therefore, sequence blocks that can confirm and/or reject either of these leads may be applied next in the series to facilitate a guided and more rapid convergence in the pattern matching process.

This embodiment of method 400 also includes, at 450, controlling the NMR apparatus to characterize at least one of the resonant species. In one embodiment, the characterizing may be a function of comparing the signal evolution to one or more stored (e.g., known, simulated, predicted) signal evolutions. Comparing the acquired signal evolution to a stored signal evolution may include, for example, controlling the NMR apparatus to compare the signal evolution to members of a multi-dimensional set of NMR signal evolutions. A first dimension in the multi-dimensional set may be associated with a first set of sequence block parameters and a second dimension in the multi-dimensional set may be associated with a second, different set of sequence block parameters. Since a signal evolution evolves over time, the multi-dimensional set may include a time dimension and the pattern matching process may include a path matching process that monitors the progress of the signal evolution. Additionally, since one series of varied sequence blocks may differ from another series of varied sequence blocks, the multi-dimensional set may include an order dimension where once again the pattern matching process may path match as opposed to just pattern matching.

Characterizing a resonant species may include, for example, identifying relaxation parameters including, but not limited to, T1 relaxation associated with the resonant species, T2 relaxation associated with the resonant species, off-resonance relaxation associated with the resonant species, and diffusion weighted relaxation associated with the resonant species. Characterizing a resonant species may also include, for example, identifying properties that are not relaxation parameters including, but not limited to, diffusion coefficients, spin density, proton density, magnetic field strength, gradient field strength, tissue type, and material type.

Figure 6:
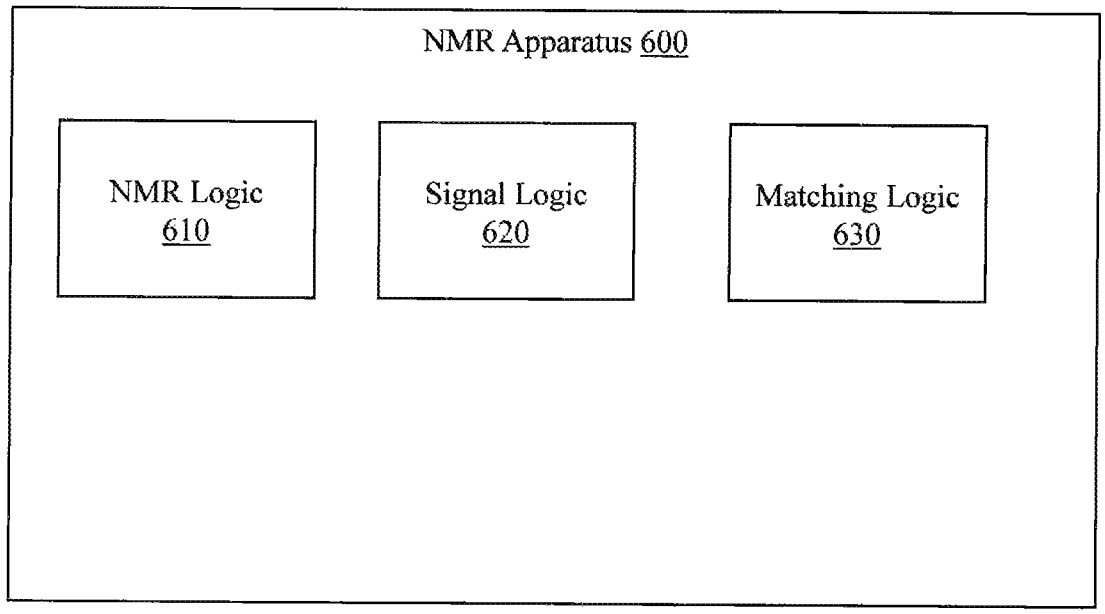
FIG. 6 illustrates an example apparatus associated with NMR fingerprinting.

FIG. 6 illustrates an NMR apparatus 600. NMR apparatus 600 includes an NMR logic 610. NMR logic 610 is configured to repetitively and variably sample an object in a (k, t, E) space to acquire a set of NMR signals that may have non-constant amplitude and/or phase. Members of the set of NMR signals are associated with different points in the (k, t, E) space. In different embodiments the different points are sampled according to a plan where t and/or E varies non-linearly and/or in a non-constant manner.

NMR apparatus 600 also includes a signal logic 620. Signal logic 620 is configured to produce an NMR signal evolution from the NMR signals. The signal evolution may include a number of NMR signals acquired over a period of time.

NMR apparatus 600 also includes a matching logic 630. Matching logic 630 is configured to compare the produced NMR signal evolution or information associated with the produced NMR signal evolution to reference information. The reference information may be, for example, a previously acquired signal evolution, a simulated signal evolution, an item derived from a signal evolution other than the produced NMR signal evolution, and other information.

Figure 7:
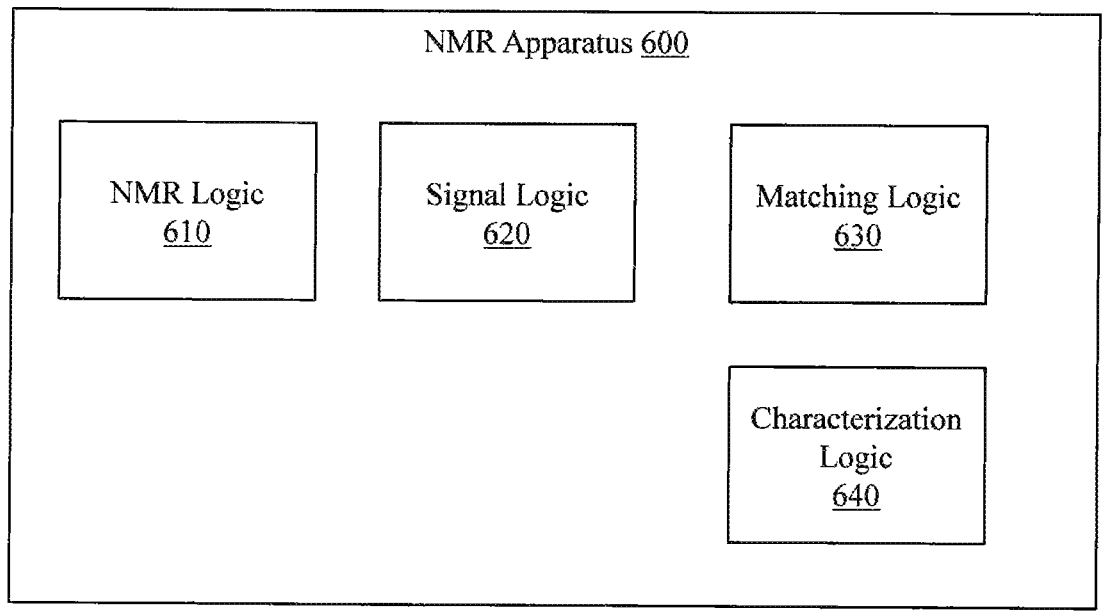
FIG. 7 illustrates an example apparatus associated with NMR fingerprinting.

FIG. 7 illustrates another embodiment of apparatus 600 (FIG. 6). This embodiment of apparatus 600 includes a characterization logic 640. Characterization logic 640 is configured to characterize a resonant species in the object. Characterizing the resonant species may include comparing the NMR signal evolution or information derived from the NMR signal evolution to reference information. The reference information may include, for example, a characterizing signal evolution(s), information derived from a characterizing signal evolution(s), and other information. Characterizing the resonant species may include identifying relaxation parameters including, but not limited to, T1 relaxation, T2 relaxation, diffusion weighted relaxation, and off-resonance relaxation. Characterizing the resonant species may also include identifying non-relaxation parameters including, but not limited to, diffusion co-efficient, spin density, proton density, tissue type, and material type.

While matching logic 630 (FIG. 6) and characterization logic 640 (FIG. 7) are illustrated as being part of NMR apparatus 600, in one embodiment, the matching logic 630 and/or the characterization logic 640 may reside in an apparatus separate from the NMR apparatus 600. In this embodiment, NMR apparatus 600 may provide NMR signals to the separate apparatus housing matching logic 630 and characterization logic 640. In one embodiment, matching logic 630 and characterization logic 640 may reside in separate apparatus.

Figure 8:
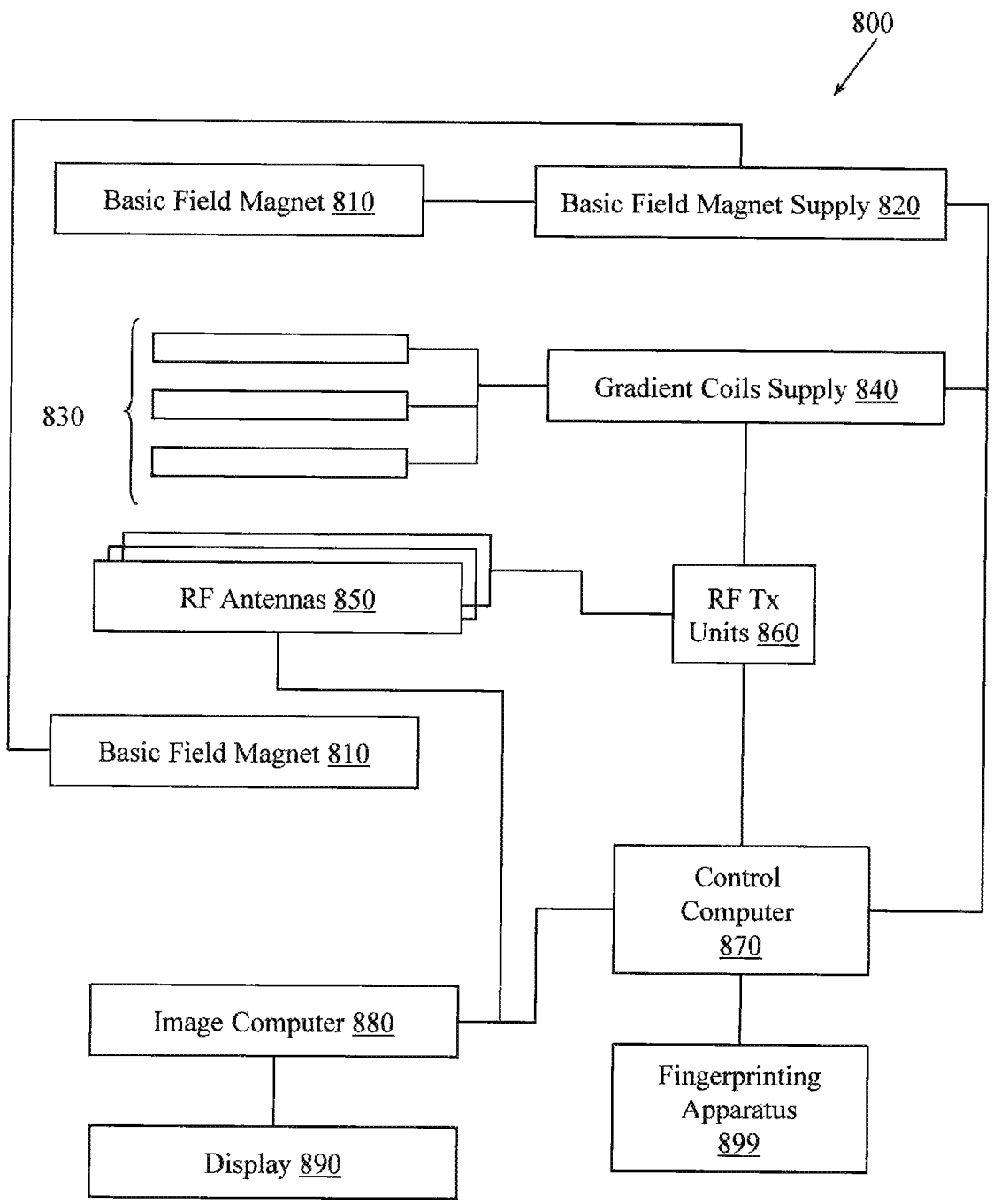
FIG. 8 illustrates an MR apparatus configured to perform NMR fingerprinting.

FIG. 8 illustrates an example MR apparatus 800 configured with a fingerprinting apparatus 899 to facilitate MR fingerprinting. The fingerprinting apparatus 899 may be configured with elements of example apparatus described herein and/or may perform example methods described herein. While fingerprinting apparatus 899 is illustrated as part of MR apparatus 800, in one example, fingerprinting apparatus 899 may be a separate apparatus or apparatuses.

The apparatus 800 includes a basic field magnet(s) 810 and a basic field magnet supply 820. Ideally, the basic field magnets 810 would produce a uniform $B_0$ field. However, in practice, the $B_0$ field may not be uniform, and may vary over an object being analyzed by the MR apparatus 800. MR apparatus 800 may include gradient coils 830 configured to emit gradient magnetic fields like $G_S$, $G_P$ and $G_R$. The gradient coils 830 may be controlled, at least in part, by a gradient coils supply 840. In some examples, the timing, strength, and orientation of the gradient magnetic fields may be controlled, and thus selectively adapted, during an MR procedure.

MR apparatus 800 may include a set of RF antennas 850 that are configured to generate RF pulses and to receive resulting nuclear magnetic resonance signals from an object to which the RF pulses are directed. In some examples, how the pulses are generated and how the resulting MR signals are received may be controlled and thus may be selectively adapted during an MR procedure. Separate RF transmission and reception coils can be employed. The RF antennas 850 may be controlled, at least in part, by a set of RF transmission units 860. An RF transmission unit 860 may provide a signal to an RF antenna 850.

The gradient coils supply 840 and the RF transmission units 860 may be controlled, at least in part, by a control computer 870. In one example, the control computer 870 may be programmed to control an NMR device as described herein. Conventionally, the magnetic resonance signals received from the RF antennas 850 can be employed to generate an image and thus may be subject to a transformation process like a two dimensional FFT that generates pixilated image data. The transformation can be performed by an image computer 880 or other similar processing device. The image data may then be shown on a display 890.

However, fingerprinting apparatus 899 facilitates not having to do conventional reconstruction of an image from MR signals received from the RF antennas 850. Thus the RF energy applied to an object by apparatus 800 need not be constrained to produce signals with substantially constant amplitudes or phases. Instead, fingerprinting apparatus 899 facilitates matching received signals to known signals for which a reconstruction, relaxation parameter, or other information is already available. This facilitates producing a quantitative result.

While FIG. 8 illustrates an example MR apparatus 800 that includes various components connected in various ways, it is to be appreciated that other MR apparatus may include other components connected in other ways.

Figure 10A:
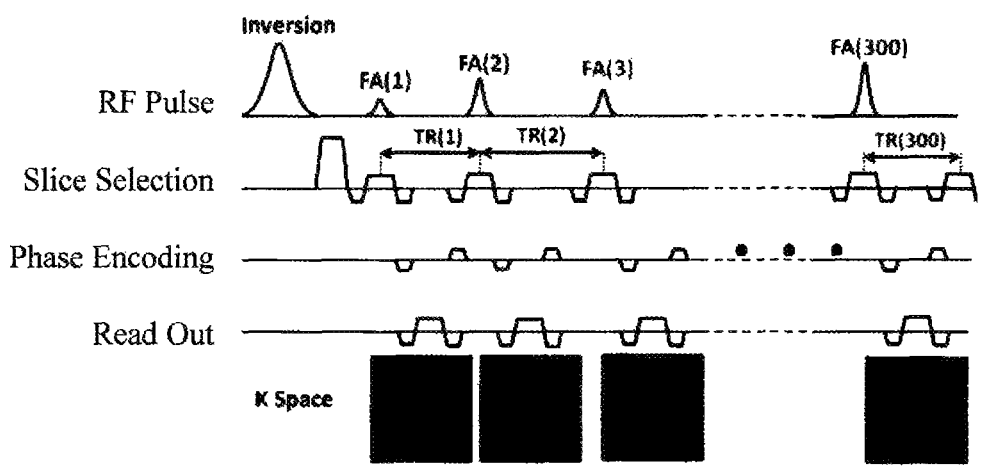
FIGS. 10a-10b illustrate an example magnetic resonance fingerprinting (MRF) sequence pattern.
Figure 10A:
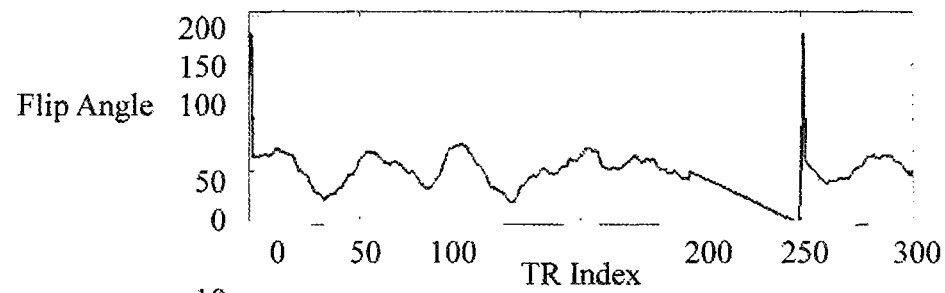
Figure 10B:
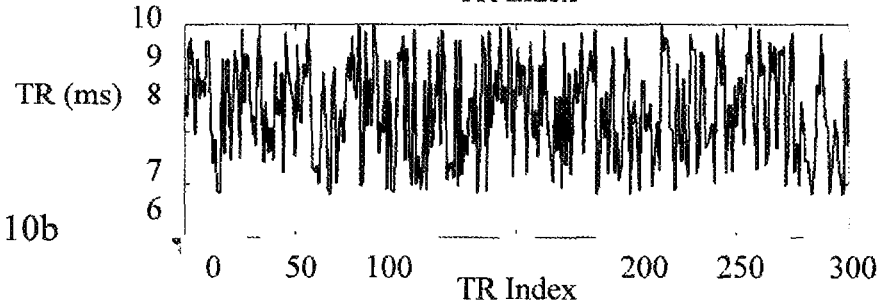

FIGS. 10a-10b illustrate an example magnetic resonance fingerprinting (MRF) sequence pattern. The terms nuclear magnetic resonance fingerprinting and magnetic resonance fingerprinting are used interchangeably herein. FIG. 10a illustrates an example acquisition sequence diagram where in different TR various sequence components are varied in a pseudorandom pattern. This basic acquisition scheme is illustrated being repeated with different spatial encoding gradients to fully encode an image for the 300 TRs of the complete acquisition. FIG. 10b illustrates an example of FA and TR patterns.

Figure 11A:
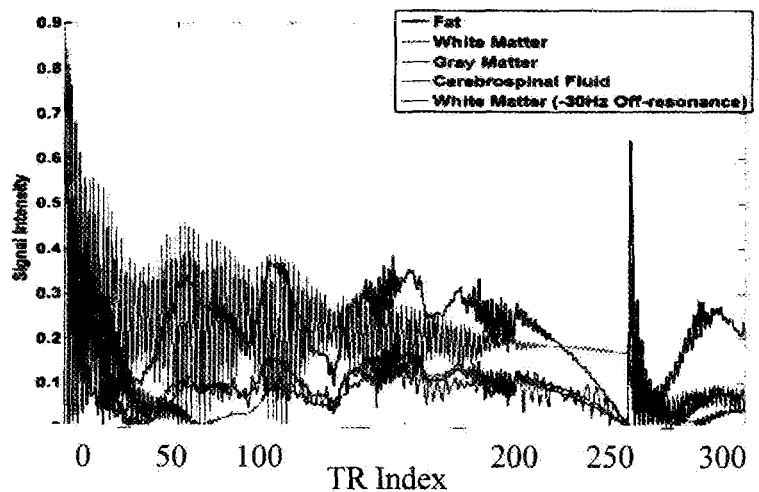
FIGS. 11a-11c illustrate example signal properties and matching results.
Figure 11B:
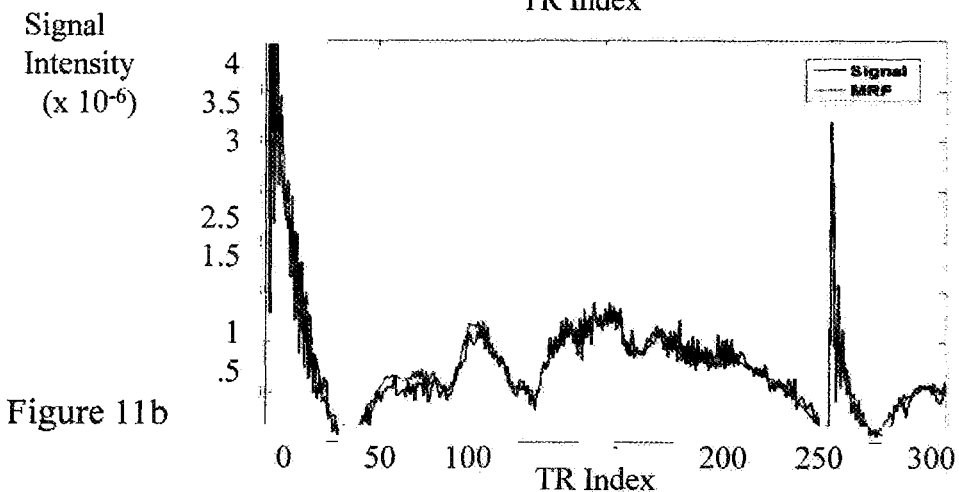
Figure 11C:
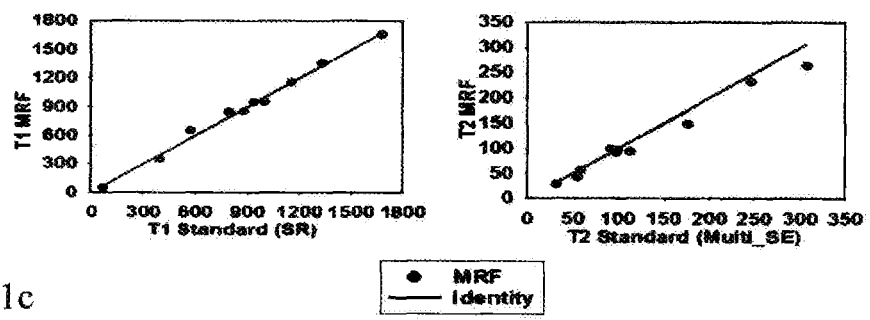

FIGS. 11a-11c illustrate example signal properties and matching results. FIG. 11a illustrates example simulated signal evolution curves corresponding to four normal brain tissues. An example signal evolution curve from white matter with off-resonance is also plotted. FIG. 11b illustrates one example of acquired signal evolution curves and a comparison to a dictionary. The retrieved $T_1$, $T_2$, proton density and off-resonance values are 800 ms, 60 ms, 0.85e-5, and −4 Hz respectively. FIG. 11c illustrates $T_1$ and $T_2$ values retrieved from a matching algorithm. A comparison of signal from ten phantoms is illustrated with the values acquired from standard spin-echo sequences. The $R^2$ values for $T_1$ and $T_2$ comparisons are 0.9952 and 0.986 respectively.

Figure 12A:
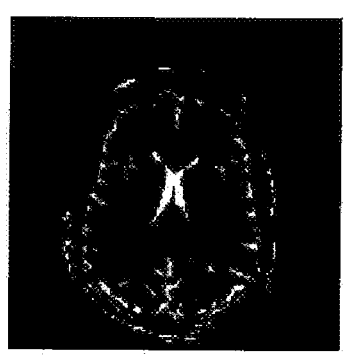
FIGS. 12a-12d illustrate example in vivo results associated with NMR fingerprinting.
Figure 12B:
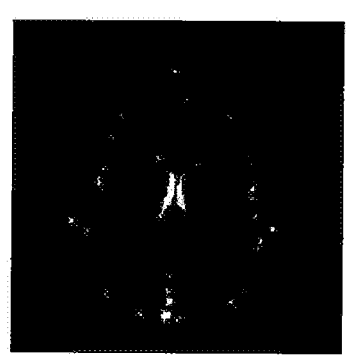
Figure 12C:
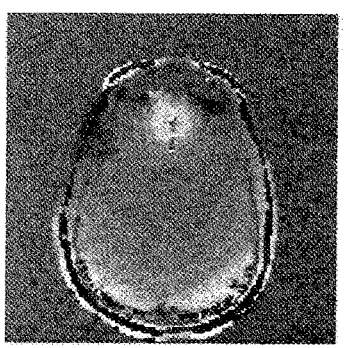
Figure 12D:
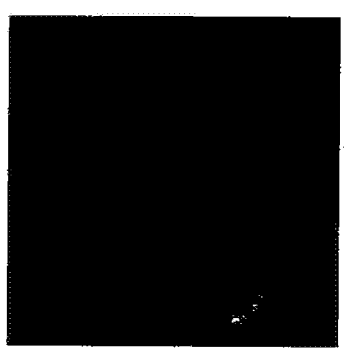

FIGS. 12a-12d illustrate in vivo results associated with NMR fingerprinting. FIG. 12a illustrates a T1 map (ms), FIG. 12b illustrates a T2 map (ms), FIG. 12c illustrates an off-resonance map (Hz), and FIG. 12d illustrates a proton density map. Information for producing FIGS. 12a-12d was acquired simultaneously using one example MRF.

Figure 13:
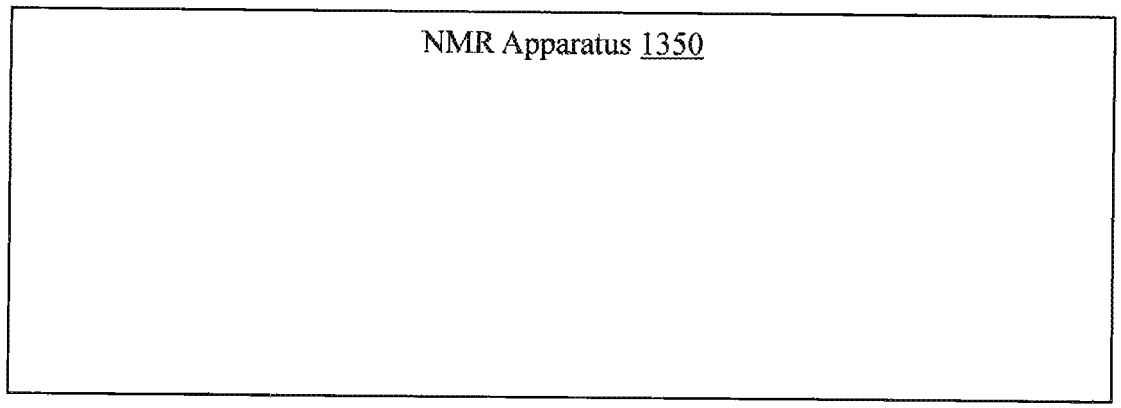
FIG. 13 illustrates an apparatus configured to compare acquired information to reference information.
Figure 13:
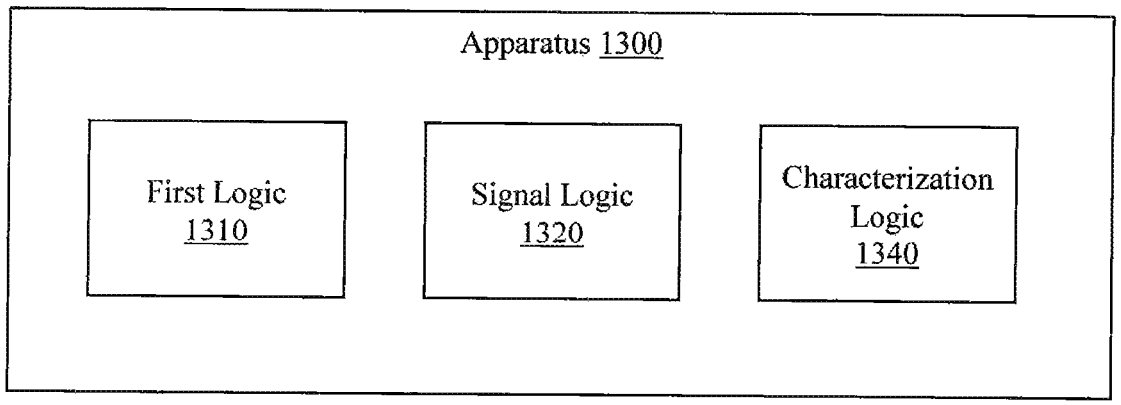

FIG. 13 illustrates an apparatus 1300 configured to compare acquired information to reference information. Apparatus 1300 includes a first logic 1310 configured to receive a first set of data from an NMR apparatus 1350. NMR apparatus 1350 is configured to repetitively and variably sample a (k, t, E) space associated with an object to acquire a set of NMR signals. Members of the set of data are associated with different points in the (k, t, E) space, where t is time and E includes at least one of, T1, T2, and one other parameter, T1 being spin-lattice relaxation, and T2 being spin-spin relaxation, and where one or more of, t, and E, vary non-linearly.

Apparatus 1300 also includes a signal logic 1320 that is configured to produce an NMR signal evolution from the first set of data. In one embodiment, the (k, t, E) space is a produced as a function of applying RF energy to an object according to two or more different sequence blocks. Recall that a sequence block includes one or more excitation phases, one or more readout phases, and one or more waiting phases, and that at least one member of the two or more sequence blocks differs from at least one other member of the two or more sequence blocks in at least one of, the number of α2 pulses in a sequence block, the spacing of α2 pulses in a sequence block, the phase of α2 pulses in a sequence block, and the amplitude of α2 pulses in a sequence block.

Apparatus 1300 also includes a characterization logic 1340 that is configured to characterize the object based, at least in part, on comparing the first set of data to a reference set of data. In one embodiment, the characterization logic 1340 may be configured to provide image pixel data suitable for producing a diagnostic image. The image pixel data is identified from comparisons between the first set of data and the reference set of data and between the reference set of data and the image pixel data. In another embodiment, the characterization logic 1340 may be configured to provide diagnostic information. The diagnostic information is identified from comparisons between the first set of data and the reference set of data and between the reference set of data and the image pixel data.

In one embodiment, characterizing the object includes providing information concerning items including, but not limited to, T1 associated with the object, T2 associated with the object, a diffusion coefficient associated with the object, a spin density associated with the object, a proton density associated with the object, a magnetic field to which the object was exposed, a gradient field to which the object was exposed, a tissue type of the object, and an identification of the object.

In one embodiment, characterizing the object may include performing actions including, but not limited to, identifying a portion of the reference set of data related to the first set of data, identifying a degree to which a portion of the reference set of data is related to the first set of data, and identifying the likelihood that a portion of the reference set of data is related to the first set of data.

In one embodiment, the first set of data may have data including, but not limited to, the NMR signals acquired from the object in response to the NMR fingerprinting excitation, a signal evolution produced from the NMR signals acquired from the object in response to the NMR fingerprinting excitation, and information derived from the signal evolution produced from the NMR signals acquired from the object in response to the NMR fingerprinting excitation. The information derived from the signal evolution may include, for example, information derived by transforming the signal evolution, information derived by combining the signal evolution with one or more other signal evolutions, and information derived by decomposing the signal evolution.

In different embodiments, the reference set of data may include, but is not limited to including, a previously acquired NMR signal, a modeled NMR signal, a previously acquired signal evolution, a modeled signal evolution, information derived from a reference signal evolution, and non-signal evolution information. The information derived from the reference signal evolution may include, but is not limited to, information derived by transforming the reference signal evolution, information derived by combining the reference signal evolution with one or more other reference signal evolutions, and information derived by decomposing the reference signal evolution.

In one embodiment, comparing the first set of data to the reference set of data may include, but is not limited to, pattern matching, selecting, minimizing, and optimizing. Pattern matching may include, but is not limited to, orthogonal matching pursuit, categorical sequence labeling, regression, clustering, classification, real valued sequence labeling, parsing, Bayesian methods, Markov methods, ensemble learning methods, and template matching. Optimization may include, but is not limited to, least squares optimization, regularized least squares optimization, basis pursuit optimization, and matching pursuit optimization.

While example systems, methods, and so on have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and so on described herein. Therefore, the invention is not limited to the specific details, the representative apparatus, and illustrative examples shown and described. Thus, this application is intended to embrace alterations, modifications, and variations that fall within the scope of the appended claims.

To the extent that the term "includes" or "including" is employed in the detailed description or the claims, it is intended to be inclusive in a manner similar to the term "comprising" as that term is interpreted when employed as a transitional word in a claim.

To the extent that the term "or" is employed in the detailed description or claims (e.g., A or B) it is intended to mean "A or B or both". When the applicants intend to indicate "only A or B but not both" then the term "only A or B but not both" will be employed. Thus, use of the term "or" herein is the inclusive, and not the exclusive use. See, Bryan A, Garner, A Dictionary of Modern Legal Usage 624 (2d. Ed. 1995).

To the extent that the phrase "one of, A, B, and C" is employed herein, (e.g., a data store configured to store one of, A, B, and C) it is intended to convey the set of possibilities A, B, and C, (e.g., the data store may store only A, only B, or only C). It is not intended to require one of A, one of B, and one of C. When the applicants intend to indicate "at least one of A, at least one of B, and at least one of C", then the phrasing "at least one of A, at least one of B, and at least one of C" will be employed.

To the extent that the phrase "one or more of, A, B, and C" is employed herein, (e.g., a data store configured to store one or more of, A, B, and C) it is intended to convey the set of possibilities A, B, C, AB, AC, BC, ABC, AA . . . A, BB . . . B, CC . . . C, AA . . . ABB . . . B, AA . . . ACC . . . C, BB . . . BCC . . . C, or AA . . . ABB . . . BCC . . . C (e.g., the data store may store only A, only B, only C, A&B, A&C, B&C, A&B&C, or other combinations thereof including multiple instances of A, B, or C). It is not intended to require one of A, one of B, and one of C. When the applicants intend to indicate "at least one of A, at least one of B, and at least one of C", then the phrasing "at least one of A, at least one of B, and at least one of C" will be employed.

What is claimed is:

1. A method, comprising:
    exposing a material to nuclear magnetic resonance (NMR) fingerprinting excitation using an NMR system by:
        controlling the NMR apparatus to apply radio frequency (RF) energy to the material in a series of variable sequence blocks, where a sequence block includes one or more excitation phases, one or more readout phases, and one or more waiting phases,
        where the material contains a plurality of resonant species,
        where the RF energy applied during a sequence block is configured to cause the plurality of resonant species in the material to simultaneously produce NMR signals, wherein each resonant species in the material simultaneously produces a respective NMR signal to produce the NMR signals, and
        where at least one member of the series of variable sequence blocks differs from at least one other member of the series of variable sequence blocks in at least N sequence block parameters, N being an integer greater than one;
    acquiring NMR signals from the material elicited by the NMR fingerprinting excitation; and
    indicating a presence of the material and quantifying a property of the material exposed to the NMR fingerprinting excitation by comparing first information associated with the NMR signals acquired from the material in response to the NMR fingerprinting excitation to reference information associated with the NMR fingerprinting excitation.

2. The method of claim 1, where quantifying the property includes quantifying one or more of, T1 associated with the material, T2 associated with the material, a diffusion coefficient associated with the material, a spin density associated with the material, a proton density associated with the material, a magnetic field to which the material was exposed, or a gradient field to which material was exposed, T1 being spin-lattice relaxation, and T2 being spin-spin relaxation.

3. The method of claim 2, where quantifying the property includes one or more of, identifying a portion of the reference information related to the first information, identifying a degree to which a portion of the reference information is related to the first information, and identifying the likelihood that a portion of the reference information is related to the first information.

4. The method of claim 1, where the first information includes one or more of, the NMR signals acquired from the material in response to the NMR fingerprinting excitation, a signal evolution produced from the NMR signals acquired from the material in response to the NMR fingerprinting excitation, and information derived from the signal evolution produced from the NMR signals acquired from the material in response to the NMR fingerprinting excitation.

5. The method of claim 4, where the information derived from the signal evolution includes one or more of, information derived by transforming the signal evolution, information derived by combining the signal evolution with one or more other signal evolutions, and information derived by decomposing the signal evolution.

6. The method of claim 1, where the reference information includes one or more of, a previously acquired NMR signal, a modeled NMR signal, a previously acquired signal evolution, a modeled signal evolution, information derived from a reference signal evolution, and non-signal evolution information.

7. The method of claim 6, where the information derived from the reference signal evolution includes one or more of, information derived by transforming the reference signal evolution, information derived by combining the reference signal evolution with one or more other reference signal evolutions, and information derived by decomposing the reference signal evolution.

8. The method of claim 1, where comparing the first information to the reference information includes one or more of, pattern matching, selecting, minimizing, and optimizing.

9. The method of claim 8, where pattern matching includes one or more of, orthogonal matching pursuit, categorical sequence labeling, regression, clustering, classification, real valued sequence labeling, parsing, Bayesian methods, Markov methods, ensemble learning methods, and template matching.

10. The method of claim 8, where optimization includes one or more of, least squares optimization, regularized least squares optimization, basis pursuit optimization, and matching pursuit optimization.

11. The method of claim 1, where the sequence block parameters comprise echo time, flip angle, phase encoding, diffusion encoding, flow encoding, RF pulse amplitude, RF pulse phase, number of RF pulses, type of gradient applied between an excitation portion of a sequence block and a readout portion of a sequence block, number of gradients applied between an excitation portion of a sequence block and a readout portion of a sequence block, type of gradient applied between a readout portion of a sequence block and an excitation portion of a sequence block, number of gradients applied between a readout portion of a sequence block and an excitation portion of a sequence block, type of gradient applied during a readout portion of a sequence block, number of gradients applied during a readout portion of a sequence block, amount of RF spoiling, and amount of gradient spoiling.

12. The method of claim 1, comprising:
    controlling the NMR apparatus to vary one or more of, the amount of time between sequence blocks in the series of variable sequence blocks, the relative amplitude of RF pulses in sequence blocks in the series of variable sequence blocks, and the relative phase of RF pulses in sequence blocks in the series of variable sequence blocks.

13. The method of claim 1, where N is greater than two and where at least one percent of the members of the series of variable sequence blocks are unique.

14. The method of claim 1, where the reference information includes signal evolutions outside the set of signal evolutions characterized by:

$$SE = A - Be^{t/C}$$

where:
SE is a signal evolution,
A is a constant,
B is a constant,
t is time, and
C is a single relaxation parameter.

15. A method, comprising:
controlling an NMR apparatus to expose the material to NMR fingerprinting excitation by:
controlling the NMR apparatus to apply radio frequency (RF) energy to the material in a series of variable sequence blocks, where a sequence block includes one or more excitation phases, one or more readout phases, and one or more waiting phases,
where the material contains one or more resonant species,
where the RF energy applied during a sequence block is configured to cause the one or more resonant species in the material to simultaneously produce NMR signals, wherein each resonant species in the material simultaneously produces a respective NMR signal to produce the NMR signals,
where at least one member of the series of variable sequence blocks differs from at least one other member of the series of variable sequence blocks in at least N sequence block parameters, N being an integer greater than one,
characterizing a property of a material exposed to nuclear magnetic resonance (NMR) fingerprinting excitation by comparing first information associated with NMR signals acquired from the material in response to the NMR fingerprinting excitation to reference information associated with NMR fingerprinting excitation, and
where the reference information includes signal evolutions selected from a set of signals described by:

$$SE = \prod_{i=1}^{N_A} \sum_{j=1}^{N_{RF}} R_i(\alpha) R_{RF_{ij}}(\alpha, \varphi) R(G) E_i(T1, T2, D)$$

where:
SE is a signal evolution,
$N_A$ is a number of sequence blocks,
$N_{RF}$ is a number of RF pulses in a sequence block,
α is a flip angle,
φ is a phase angle,
Ri(α) is a rotation due to off resonance,
$R_{RF_{ij}}(\alpha, \varphi)$ is a rotation due to RF differences,
R(G) is a rotation due to a gradient,
T1 is spin-lattice relaxation,
T2 is spin-spin relaxation,
D is diffusion relaxation, and
$E_i(T1, T2, D)$ is associated with magnetization differences.

16. A method, comprising:
controlling an NMR apparatus to expose the material to NMR fingerprinting excitation by:
controlling the NMR apparatus to apply radio frequency (RF) energy to the material in a series of variable sequence blocks, where a sequence block includes one or more excitation phases, one or more readout phases, and one or more waiting phases,
where the material contains one or more resonant species,
where the RF energy applied during a sequence block is configured to cause the one or more resonant species in the material to simultaneously produce NMR signals, wherein each resonant species in the material simultaneously produces a respective NMR signal to produce the NMR signals,
where at least one member of the series of variable sequence blocks differs from at least one other member of the series of variable sequence blocks in at least N sequence block parameters, N being an integer greater than one,
characterizing a property of a material exposed to nuclear magnetic resonance (NMR) fingerprinting excitation by comparing first information associated with NMR signals acquired from the material in response to the NMR fingerprinting excitation to reference information associated with NMR fingerprinting excitation, and
where the reference information includes signal evolutions selected from a set of signals described by:

$$SE = \prod_{i=1}^{N_A} \prod_{j=1}^{N_{RF}} R_i(\alpha) R_{RF_{ij}}(\alpha, \varphi) R(G) E_i(T1, T2, \ldots)$$

where:
SE is a signal evolution,
$N_A$ is a number of sequence blocks,
$N_{RF}$ is a number of RF pulses in a sequence block,
α is a flip angle,
φ is a phase angle,
Ri(α) is a rotation due to off resonance,
$R_{RF_{ij}}(\alpha, \varphi)$ is a rotation due to RF differences,
R(G) is a rotation due to a gradient,
T1 is spin-lattice relaxation,
T2 is spin-spin relaxation, and
$E_i(T1, T2, \ldots)$ is associated with magnetization changes.

17. An apparatus, comprising:
a first logic configured to receive a first set of data from an NMR apparatus configured to repetitively and variably sample a (k, t, E) space associated with an object to acquire a set of NMR signals, where members of the set of data are associated with different points in the (k, t, E) space, where t is time and E includes at least one of, T1, T2, and one other parameter, T1 being spin-lattice relaxation, and T2 being spin-spin relaxation, and where one or more of, t, and E, vary non-linearly;
a signal logic configured to produce an NMR signal evolution from the first set of data, and
a characterization logic configured to characterize the object based, at least in part, on comparing the first set of data to a reference set of data.

18. The apparatus of claim 17, where the characterization logic is configured to provide image pixel data suitable for producing a diagnostic image, where the image pixel data is identified from comparisons between the first set of data and the reference set of data and between the reference set of data and the image pixel data.

19. The apparatus of claim 17, where the characterization logic is configured to provide diagnostic information, where the diagnostic information is identified from comparisons between the first set of data and the reference set of data and between the reference set of data and the image pixel data.

20. The apparatus of claim 17, where the (k, t, E) space is produced as a function of applying RF energy to the object according to two or more different sequence blocks, where a sequence block includes one or more excitation phases, one or more readout phases, and one or more waiting phases, where at least one member of the two or more sequence blocks differs from at least one other member of the two or more sequence blocks in at least one of, the number of α2 pulses in a sequence block, the spacing of α2 pulses in a sequence block, the phase of α2 pulses in a sequence block, and the amplitude of α2 pulses in a sequence block.

21. The apparatus of claim 17, where the characterization logic is configured to provide information concerning one or more of, T1 associated with the object, T2 associated with the object, a diffusion coefficient associated with the object, a spin density associated with the object, a proton density associated with the object, a magnetic field to which the object was exposed, a gradient field to which the object was exposed, a tissue type of the object, and an identification of the object.

22. The apparatus of claim 17, where the characterization logic is configured to identify one or more of, a portion of the reference set of data related to the first set of data, a degree to which a portion of the reference set of data is related to the first set of data, and the likelihood that a portion of the reference set of data is related to the first set of data.

23. The apparatus of claim 17, where the first set of data includes one or more of, the NMR signals acquired from the object in response to the NMR fingerprinting excitation, a signal evolution produced from the NMR signals acquired from the object in response to the NMR fingerprinting excitation, and information derived from the signal evolution produced from the NMR signals acquired from the object in response to the NMR fingerprinting excitation.

24. The apparatus of claim 23, where the information derived from the signal evolution includes one or more of, information derived by transforming the signal evolution, information derived by combining the signal evolution with one or more other signal evolutions, and information derived by decomposing the signal evolution.

25. The apparatus of claim 17, where the reference set of data includes one or more of, a previously acquired NMR signal, a modeled NMR signal, a previously acquired signal evolution, a modeled signal evolution, information derived from a reference signal evolution, and non-signal evolution information.

26. The apparatus of claim 25, where the information derived from the reference signal evolution includes one or more of, information derived by transforming the reference signal evolution, information derived by combining the reference signal evolution with one or more other reference signal evolutions, and information derived by decomposing the reference signal evolution.

27. The apparatus of claim 17, where the characterization logic is configured to compare the first set of data to the reference set of data using one or more of, pattern matching, selecting, minimizing, and optimizing.

28. The apparatus of claim 27, where pattern matching includes one or more of, orthogonal matching pursuit, categorical sequence labeling, regression, clustering, classification, real valued sequence labeling, parsing, Bayesian methods, Markov methods, ensemble learning methods, and template matching.

29. The apparatus of claim 25, where optimization includes one or more of, least squares optimization, regularized least squares optimization, basis pursuit optimization, and matching pursuit optimization.

30. The method of claim 1, where quantifying the property of the material exposed to the NMR fingerprinting excitation includes quantifying the property of the material and wherein the property includes at least one of spin-lattice relaxation (T1), spin-spin relaxation (T2), a diffusion coefficient, a spin density, or a proton density.

* * * * *